(12) United States Patent
Hong

(10) Patent No.: US 10,522,748 B2
(45) Date of Patent: Dec. 31, 2019

(54) SPIN-ORBIT TORQUE MAGNETIC DEVICE

(71) Applicant: UNIVERSITY-INDUSTRY FOUNDATION (UIF), YONSEI UNIVERSITY, Seoul (KR)

(72) Inventor: Jongill Hong, Seoul (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 16/115,918

(22) Filed: Aug. 29, 2018

(65) Prior Publication Data
US 2019/0103553 A1 Apr. 4, 2019

(30) Foreign Application Priority Data
Aug. 31, 2017 (KR) .................. 10-2017-0111287

(51) Int. Cl.
*H01F 10/32* (2006.01)
*H01L 43/10* (2006.01)
*H01L 43/08* (2006.01)
*H01L 43/02* (2006.01)

(52) U.S. Cl.
CPC ........... *H01L 43/10* (2013.01); *H01F 10/329* (2013.01); *H01F 10/3286* (2013.01); *H01L 43/02* (2013.01); *H01L 43/08* (2013.01)

(58) Field of Classification Search
CPC ...... G11C 11/161; H01F 10/329; H01L 43/10
See application file for complete search history.

(56) References Cited

U.S. PATENT DOCUMENTS

| | | | | |
|---|---|---|---|---|
| 2011/0140217 A1* | 6/2011 | Nguyen | ................. | B82Y 25/00 257/421 |
| 2014/0175582 A1* | 6/2014 | Apalkov | ................. | H01L 43/08 257/425 |
| 2014/0264671 A1* | 9/2014 | Chepulskyy | ............ | H01L 43/08 257/421 |

* cited by examiner

Primary Examiner — Thomas L Dickey

(57) ABSTRACT

The present invention relates to a magnetic device including a spin-current pattern generating a spin current perpendicular to a main plane of the spin-current pattern by an in-plane current, and a free magnetic layer disposed in contact with the spin-current pattern and having a perpendicular magnetic anisotropy magnetically switchable by the spin current.

20 Claims, 9 Drawing Sheets

SPIN-ORBIT TORQUE MAGNETIC DEVICE

CROSS-REFERENCE TO RELATED APPLICATION

This application claims priority of Korean Patent Application No. 10-2017-0111287, filed on Aug. 31, 2017, in the KIPO (Korean Intellectual Property Office), the disclosure of which is incorporated herein entirely by reference.

BACKGROUND OF THE INVENTION

Field of the Invention

The present invention relates to a spin-orbit torque magnetic device, and more particularly, to a spin-orbit torque magnetic device using a hetero-lattice stack structure to increase a spin-orbit torque.

Description of the Related Art

Recently, it is known that a spin-orbit coupling generates a spin-orbit torque. That is, a spin-orbit coupling may induce a spin-hole effect, which may produce a spin-orbit torque.

The spin-orbit torque may be generated in a case that a structure in which free magnetic layers such as Fe, Co, and Ni are disposed on non-magnetic layers such as Pt, Ta, and W. The non-magnetic layer may generate the spin Hall effect by an in-plane current. When the in-plane current is injected into the non-magnetic layer, electrons having a specific direction spin may be injected into the free magnetic layer by the spin Hall effect. The spin current may switch the magnetization direction of the free magnetic layer.

The magnetic layer having a perpendicular magnetic anisotropy may maintain well the magnetization state even if the device size is shrunk, which is advantageous for high density integration of the device. However, there is a need for a structure and a method that may increase spin-orbit coupling, so that magnetization inversion of the magnetic layer may be performed even at a low injection current.

SUMMARY OF THE INVENTION

An object of the present invention is to provide a spin-orbit torque magnetic device that increases the spin-orbit torque.

Another object of the present invention is to provide a magnetic device having a perpendicular magnetic anisotropy and exhibiting a large spin-orbit coupling performance.

A magnetic device according to an embodiment of the present invention includes a spin-current pattern disposed on a substrate and generating a spin current perpendicular to the arrangement plane by an in-plane current; and a free magnetic layer disposed in contact with the spin-current pattern and having a perpendicular magnetic anisotropy magnetically reversed by the spin current. The spin-current pattern comprises a first non-magnetic conductive layer; a second non-magnetic conductive layer arranged in alignment with the first non-magnetic conductive layer; and a magnetic layer interposed between the first non-magnetic conductive layer and the second non-magnetic conductive layer, aligned with the first non-magnetic conductive layer and having a perpendicular magnetic anisotropy. The magnetic layer is subjected to a tensile strain due to the first non-magnetic conductive layer and the second non-magnetic conductive layer, and the magnetic layer has a crystal structure. The reference bulk lattice constant of the magnetic layer is smaller than the lattice constant of the first non-magnetic conductive layer or the second non-magnetic conductive layer. The strain in the longitudinal direction parallel to the main surface direction of the magnetic layer, which is provided as the ratio of the thin film lattice constant of the magnetic layer with respect to a reference bulk lattice constant of the magnetic layer, may be 9 percent or more.

In one embodiment of the present invention, the magnetic layer may be reduced by hydrogen ion irradiation, the magnetic layer may be phase-changed from a paramagnetic material to a ferromagnetic material by the hydrogen ion irradiation, and the lattice constant may be maintained at the lattice constant of the non-magnetic conductive layer.

In one embodiment of the present invention, the non-magnetic oxide layer may be $Co_3O_4$, and the magnetic layer may be Co. In one embodiment of the present invention, the magnetic layer may be in a pseudomorphic epitaxial state so as to match the lattice constant of the non-magnetic conductive layer.

In one embodiment of the present invention, the thickness of the magnetic layer may be 0.2 nm to 0.6 nm.

In one embodiment of the present invention, the free magnetic layer may further include a fixed magnetic layer arranged in alignment with the free magnetic layer; and a tunnel insulating layer disposed in alignment with the free magnetic layer, and interposed between the free magnetic layer and the fixed magnetic layer.

In one embodiment of the present invention, the non-magnetic conductive layer may be Pd, and the magnetic layer may be Co.

In one embodiment of the present invention, the spin-current pattern may further include at least a pair of auxiliary non-magnetic conductive layers and an auxiliary magnetic layer alternately disposed between the first non-magnetic conductive layer and the magnetic layer. The auxiliary non-magnetic conductive layer and the auxiliary magnetic layer may provide a multilayer thin film structure.

A spin-orbit torque magnetic device according to an embodiment of the present invention includes a spin-current pattern disposed on a substrate and generating a spin current perpendicular to the arrangement plane by an in-plane current; and a free magnetic layer disposed in contact with the spin-current pattern and magnetically reversed by the spin current. The free magnetic layer includes a magnetic layer and a non-magnetic conductive layer which have a multilayer thin film structure disposed alternately to each other. The magnetic layer has a perpendicular magnetic anisotropy and is magnetically reversed by the spin current, and the magnetic layer receives a tensile strain by the non-magnetic conductive layer. The strain in the longitudinal direction, which is provided as the ratio of the thin film lattice constant of the magnetic layer to the reference bulk lattice constant of the magnetic layer may be 9 percent or more.

In one embodiment of the present invention, the magnetic layer may be reduced by hydrogen ion irradiation, the magnetic layer may be phase-changed from a paramagnetic material to a ferromagnetic material by the hydrogen ion irradiation, and the lattice constant may be maintained at the lattice constant of the non-magnetic conductive layer.

In one embodiment of the present invention, the non-magnetic oxide layer may be $Co_3O_4$, and the magnetic layer may be Co.

In one embodiment of the present invention, the magnetic layer may be in a pseudomorphic epitaxial state so as to match the lattice constant of the non-magnetic conductive layer.

In one embodiment of the present invention, the thickness of the magnetic layer may be 0.2 nm to 0.6 nm.

In one embodiment of the present invention, the free magnetic layer may further include a fixed magnetic layer arranged in alignment with the free magnetic layer; and a tunnel insulating layer disposed in alignment with the free magnetic layer, and interposed between the free magnetic layer and the fixed magnetic layer. In one embodiment of the present invention, the non-magnetic conductive layer may be Pd, and the magnetic layer may be Co.

The spin-orbit torque of the magnetic device according to an embodiment of the present invention may provide a large transverse effective magnetic field and a longitudinal effective magnetic field by the stacked structure of a non-magnetic conductive layer and a magnetic layer into which the tensile strain is induced, thereby increasing the size and efficiency. Therefore, it is possible to reduce consumption power in driving a magnetic memory element based on a spin-orbit torque and to provide an advantage to perform reliable information writing and erasing operations.

Further, the magnetic device has a large perpendicular magnetic anisotropy, which is advantageous for its integration and scaling-down.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
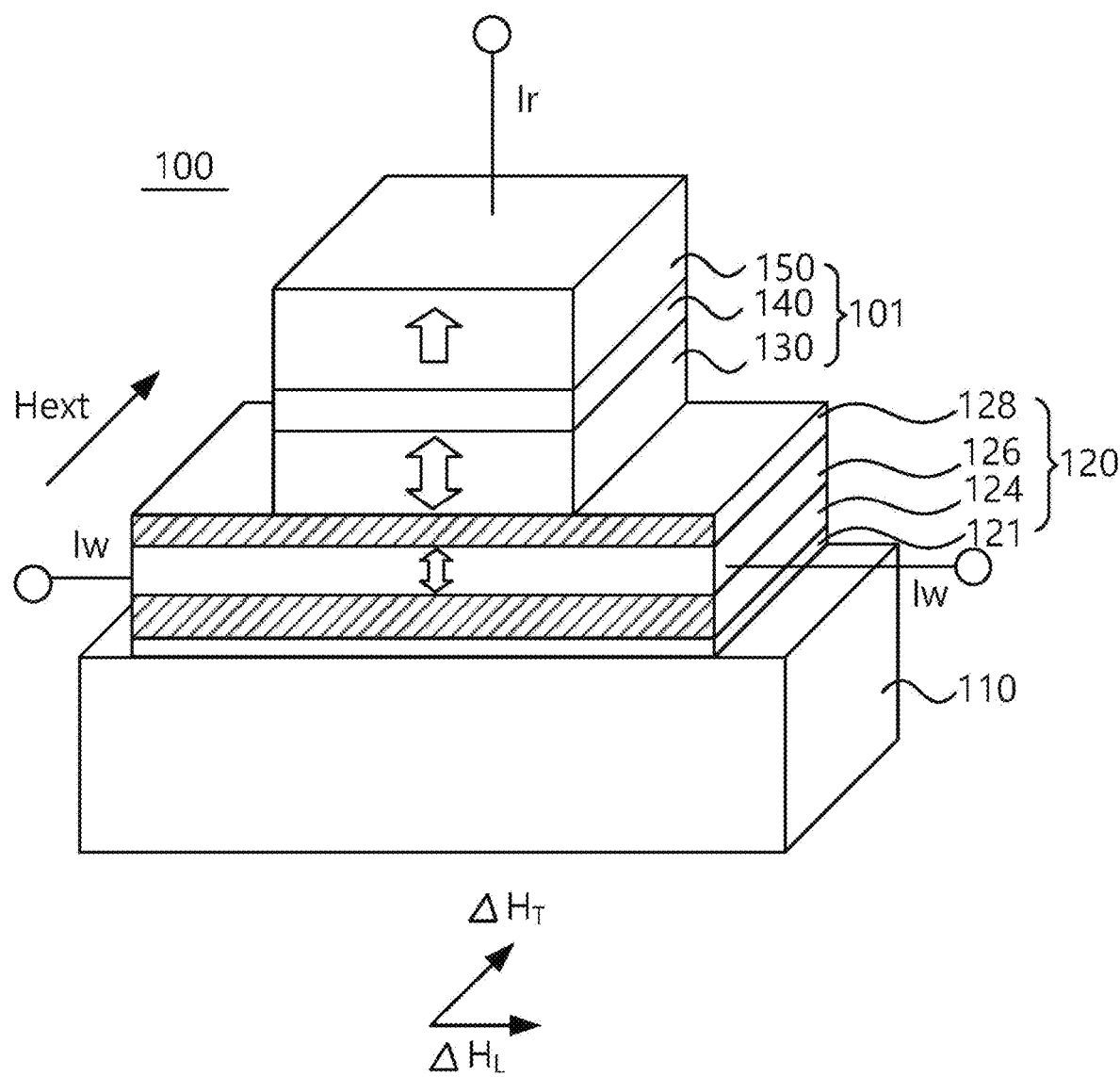
FIG. 1 is a perspective view illustrating a spin-orbit torque magnetic device according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific, terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

The inventor of the present invention has published a paper entitled "Nanoscale patterning of complex magnetic nanostructures by reduction with low-energy protons" in NATURE NANOTECHNOLOGY, Vol. 7, September, 2012, pp. 567-571. In this paper, it was reported that non-magnetic oxides [$Co_3O_4$/Pd]n produced a reduced ferromagnetic metal [Co/Pd]$_{10}$ through low-energy proton irradiation. The reduced [Co/Pd]$_n$ superlattices exhibited higher perpendicular magnetic anisotropy than a conventional metal [Co/Pd]$_n$ superlattices.

According to one embodiment of the present invention, we have confirmed that the reduced [Co/Pd]$_n$ superlattice provides a large spin-orbit torque through a further investigation.

According to one embodiment of the present invention, the spin-orbit torque of the reduced [Co/Pd]$_n$ superlattice structure may have several orders of magnitude larger than that of the conventional [Co/Pd]$_n$ superlattice structure. It is to be understood that these spin orbit torques may be generated due to an induced strain in the reduced [Co/Pd]$_n$ superlattice structure.

According to one embodiment of the present invention, the reduced [Co/Pd]$_n$ superlattice structure may be perpendicular magnetic anisotropy and may be arranged in contact with the free magnetic layer of the magnetic tunnel junction and may be used as a spin current injection layer to provide an in-plane current.

According to one embodiment of the present invention, the reduced [Co/Pd]$_n$ superlattice structure has perpendicular magnetic anisotropy and may be used as a free magnetic layer of a magnetic tunnel junction.

According to one embodiment of the present invention, a Co/Pd electron band structure having a large spin-orbit coupling may be formed, and the number of charges in the Co/Pd electron band structure may be changed by irradiating hydrogen. By adjusting the height of the Fermi energy, conductivity of a spin-hole may be adjusted to be maximized. Therefore, it is impossible to achieve such effects by conventional methods such as alloys or stresses.

According to Phys. Rev. Lett. 100, 096401 Published March 2008, the electronic band structure of Pt is disclosed. In connection with conductivity of a spin-hole, a sign and a size are changed depending on the Fermi energy level. Based on this, it is interpreted that Fermi energy may influence conductivity of the spin-hole.

According to one embodiment of the present invention, the elastically strained ferromagnetic layer may make a hetero-junction with a non-magnetic layer. Hydrogen may provide the hetero-junction that regulates Fermi energy thereof. The conductivity of a spin-hole refers to the spin current, and the conductivity of the spin-hole may be proportional to the spin-orbit torque. According to an embodiment of the present invention, the elastically strained ferromagnetic layer having a hetero-junction increases the spin-orbit coupling by the non-magnetic layer in order to improve the density of spin current, thereby improving the spin-orbit torque. Hereinafter, the present invention will now be described in detail with reference to the accompanying drawings. Hereinafter, the present invention will be described in more detail with reference to preferred embodiments. However, it will be apparent to those having a common knowledge in the related art that these embodiments are intended to explain the present invention more specifically, and the present invention is not limited to or limited by the experimental conditions, material types, and the like. The present invention is not limited to the embodiments described herein, and may be embodied in other forms. Rather, the embodiments disclosed herein are provided so that the disclosed descriptions may be explained more concretely and completely, and the concept of the invention may be conveyed sufficiently to those skilled in the art.

In the drawings, the constituting elements have been exaggerated for clarity. The parts denoted by the same numbers refer to the same elements throughout the specification.

Figure 2:
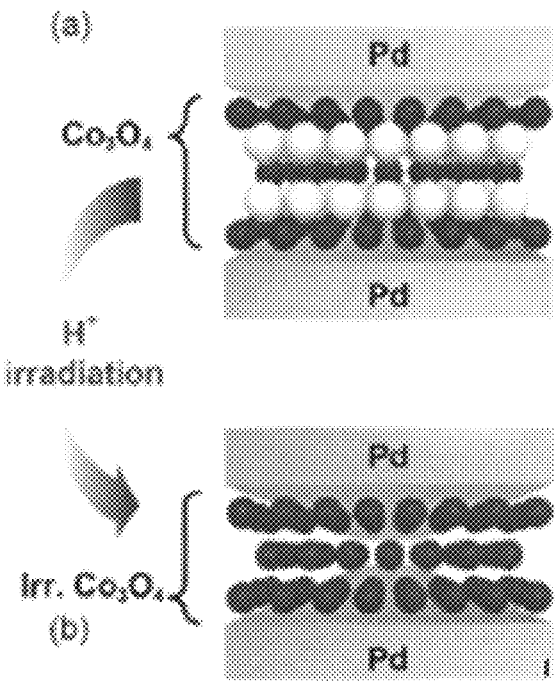
FIG. 2 is a diagram showing the crystal characteristics of the spin-orbit torque magnetic device of FIG. 1.
Figure 2:
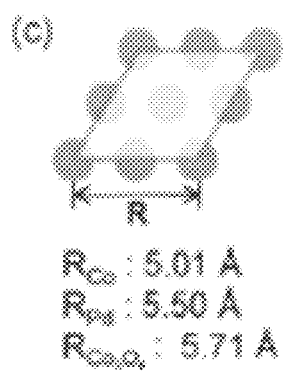
Figure 2:
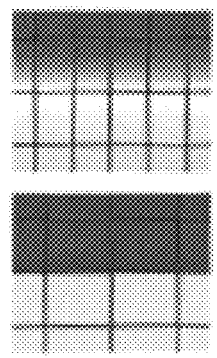
Figure 2:
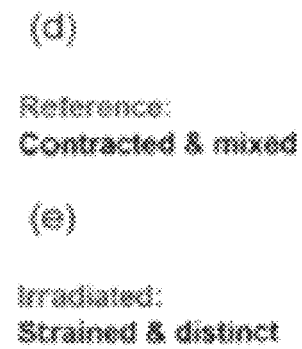
Figure 2:
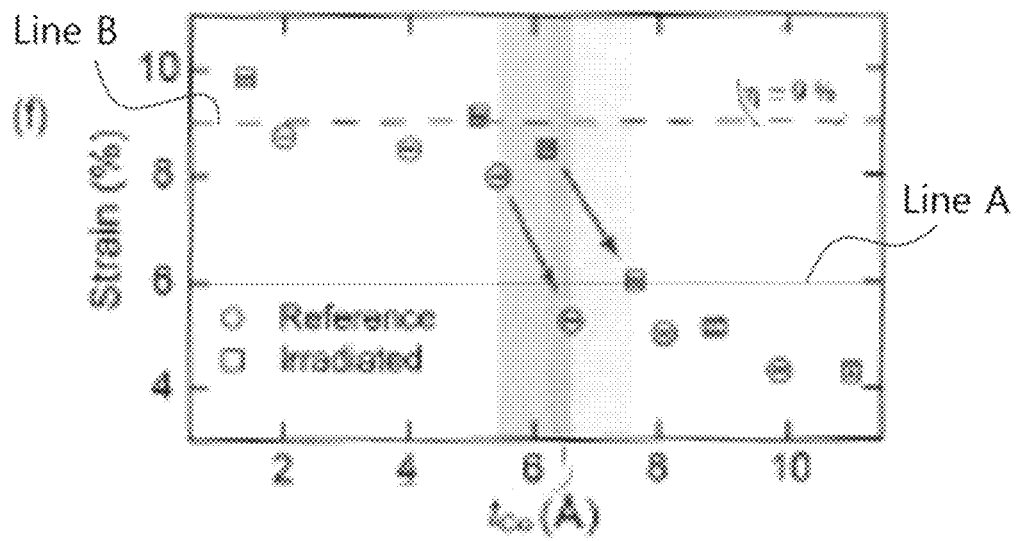

FIG. 1 is a perspective view illustrating a spin-orbit torque magnetic device 100 according to an embodiment of the present invention, and FIG. 2 is a diagram showing a crystal characteristic of the spin-orbit torque magnetic device 100 of FIG. 1.

Referring to FIGS. 1 and 2, the spin-orbit torque magnetic device 100 may be used as a magnetic random-access memory (MRAM). The spin-orbit torque magnetic device 100 is disposed on a substrate 110 and may include a spin-current pattern 120 for generating a spin current perpendicular to the arrangement plane by the in-plane current Iw; and a free magnetic layer 130 disposed in contact with the spin-current pattern and having perpendicular magnetic anisotropy which may be magnetically reversed by the spin current. The free magnetic layer 130 may be combined with the tunnel insulating layer 140. The spin-current pattern 120 includes a first non-magnetic conductive layer 124; a second non-magnetic conductive layer 128 disposed in alignment with the first non-magnetic conductive layer 124; and a magnetic layer 126 which may be interposed between the first non-magnetic conductive layer 124 and the second non-magnetic conductive layer 128, is aligned with the first non-magnetic conductive layer and has a perpendicular magnetic anisotropy. The magnetic layer 126 receives a tensile strain by the first non-magnetic conductive layer 124 and the second non-magnetic conductive layer 128. The magnetic layer 126 may have a crystal structure. The reference bulk lattice constant of the magnetic layer 126 may be smaller than the lattice constants of the first non-magnetic conductive layer 124 or the second non-magnetic conductive layer 128. The tensile strain (or referred to as a lattice strain) in a longitudinal direction parallel to a main surface of the magnetic layer 126 provided according to a ratio of the thin film lattice constant of the magnetic layer to the reference bulk lattice constant of the magnetic layer 126 may be 6% or more. Preferably, the tensile strain of the magnetic layer 126 may be greater than or equal to 9%. As compared with a case that the tensile strain of the magnetic layer 126 is less than 6%, in the present examples that the tensile strain is more than 6%, the spin orbit coupling may be drastically enhanced with the hetero junction. Event when the strain is 9% or more, the spin-orbit coupling may generate the maximum spin current. The spin-orbit coupling represents a coupling state in a direction perpendicular to the principal surface of the magnetic layer. In a hetero junction where on a non-magnetic conductive layer, for example, Pd, which is substantially not a heavy metal, and for example, a Co magnetic layer is stacked, the tensile strain 6% or more of the magnetic layer may cause a low spin-orbit coupling to be abruptly increased. When the tensile strain is 9% or more, the maximum spin current may be obtained from the increased spin-orbit coupling.

When the first non-magnetic conductive layer 124 and the second non-magnetic conductive layer 128 comprises Pd and the magnetic layer 126 comprises Co, and when considering the 2×2 lattice structure on the (111) plane, the lattice constant R of the non-magnetic conductive layer 128 is 0.550 nm and the reference bulk lattice constant R of the magnetic layer 126 is 0.501 nm. However, the thin film lattice constant of the magnetic layer 126 of the present invention is about 0.550 nm. The thin film lattice constant of the magnetic layer 126 may be achieved by hydrogen ion irradiation.

The magnetic layer 126 may be provided by reducing a starting material, that is, an oxide layer by hydrogen ion irradiation. The oxide layer may be non-magnetic or paramagnetic. The lattice constant of the oxide layer is greater than the lattice constant of the reduced magnetic layer 126. There is a merit that generation of compressive stress acting on the underlying first non-magnetic conductive layer 124 may be suppressed by forming the magnetic layer 126 from the non-magnetic oxide layer, and as a result, the lattice of the first non-magnetic conductive layer 124 may be maintained constantly. Thereby, as described above, by maintaining the tensile strain of the reduced magnetic layer 126 at 6% or more, preferably 9% or more, the spin-orbit coupling may be generated more strongly in the direction perpendicular to the main surface of the magnetic layer 126, and the generation of the spin current may be facilitated. The tensile strain induced in the magnetic layer 126 may be a physical phenomenon in which the distance between atoms varies, and thus it may provide a direct cause to change the magnitude of the interaction between the electrons of the atoms. Accordingly, the spin-orbit coupling determined by the interaction between the electrons, the electronic band structure, and the like may be controlled. For this reason, according to an embodiment of the present invention, the spin-orbit coupling may be increased through an increase in tensile strain, and in particular, according to an embodiment of the present invention, a spin-orbit coupling in the perpendicular direction at the interface between the non-magnetic body and the reduced magnetic layer. Therefore, the orbital coupling is greatly increased, which may increase the spin current in the perpendicular direction to increase the spin-orbit torque. However, the description is illustrative only and the present invention should not be construed as being limited thereto, and other theoretical explanations will be possible.

In one embodiment, the lattice constant of the non-magnetic oxide layer is 0.570 nm and the lattice constant of the reduced magnetic layer 126, i.e., the thin film lattice constant, may be 0.550 nm.

The non-magnetic or paramagnetic oxide layer may be reduced by the hydrogen ion irradiation and may be phase-changed into the ferromagnetic magnetic layer 126, and the thin film lattice constant of the magnetic layer 126 may be maintained to be the lattice constant of the first non-magnetic conductive layer 124. In one embodiment, the non-magnetic oxide layer may be $Co_3O_4$, and the magnetic layer 126 provided by its reduction may be Co. The non-magnetic oxide layer may be reduced by the hydrogen ion irradiation and then, may be changed into a ferromagnetic Co thin film, and the thin film lattice constant may substantially maintain the lattice constant of the first non-magnetic conductive layer. In the hydrogen ion irradiation step, the ion energy may be several keV (kilo electron volt) or less. Preferably, the ion energy may be in the range of 300 eV to 500 eV. Accordingly, the non-magnetic oxide may be phase-changed from a non-magnetic material or a paramagnetic material to a ferromagnetic material in a metal state. In addition, a perpendicular magnetic anisotropy may appear simultaneously with the phase change. Further, after the hydrogen ion irradiation, the interface between the reduced Co layer and the Pd layer may remain intact.

The magnetic layer and the first non-magnetic conductive layer may contain hydrogen. The hydrogen may increase the spin-orbit torque or the spin-hole conductivity by controlling the Fermi energy of the magnetic layer and the first non-magnetic conductive layer.

The spin-current pattern 120 may further include a seed layer 121. The seed layer 121 may be Ta, and the first non-magnetic conductive layer 124 may provide an interface state so that the first non-magnetic conductive layer 124 may be deposited in a crystalline state.

The magnetic tunnel junction 101 may include the free magnetic layer 130, the fixed magnetic layer 150, and the tunnel insulating layer 140 disposed between the free magnetic layer and the fixed magnetic layer. In order to increase the tunnel magnetoresistance (TMR), the magnetic tunnel junction may be a CoFeB/MgO/CoFeB structure. For example, the free magnetic layer 130 and the fixed magnetic layer 150 may be CoFeB, and the tunnel insulating layer may be MgO. The free magnetic layer 130 and the pinned magnetic layer 150 may have a perpendicular magnetic anisotropy.

The spin current generated in the spin-current pattern 120 may switch the magnetic layer 126 and simultaneously switch the free magnetic layer 130. In order to stably switch the free magnetic layer 130 using the spin-orbit torque, an external magnetic field Hext in a direction perpendicular to the main surface direction of the spin-current pattern may be applied in the arrangement plane of the spin-current pattern.

According to a modified embodiment of the present invention, the magnetic layer 126 may be formed in a pseudomorphic epitaxial state so as to match the lattice constants of the first non-magnetic conductive layer and the second non-magnetic conductive layer. For example, the first non-magnetic conductive layer 124 may be deposited in a crystalline state and the magnetic layer 126 may be deposited in a pseudomorphic epitaxial state by using a deposition method such as molecular beam epitaxy in order to maintain the lattice constant of layer 124 the first non-magnetic conductive layer.

Data recorded in the free magnetic layer 130 of the magnetic tunnel junction 101 may be discriminated through a read current flowing through a terminal connected to the fixed layer 150.

Referring again to FIG. 2, (a) shows a superlattice structure of $Co_3O_4$/Pd. (b) shows a superlattice structure of Co/Pd (referred to as 'irradiated') irradiated by hydrogen ion irradiation. a red circle represents Co atoms, and the other white circle represents an oxygen atom. (c) is a conceptual diagram of a two-dimensional 2×2 unit mesh. (d) is a conceptual diagram showing the interface state of a reference superlattice. (e) is a conceptual diagram showing the interfacial state of the irradiated superlattice structure (referred to as 'irradiated'). (f) shows changes of strain in the reference superlattice structure (referred to as 'reference') and the irradiated superlattice according to the thickness of cobalt.

Line A represents the case where the tensile strain generated in the Co layer as the magnetic layer is 6% or more, and Line B represents the case where the strain is 9% or more. At this time, the thickness of the Co layer is in the range of 0.2 nm to 0.6 nm. When the thickness of the Co layer, that is, the thickness of the magnetic layer exceeds 0.6 nm, strain relaxation may occur in the basic superlattice and the irradiated superlattice, and the spin-orbit coupling characteristics may be reduced accordingly.

Figure 3:
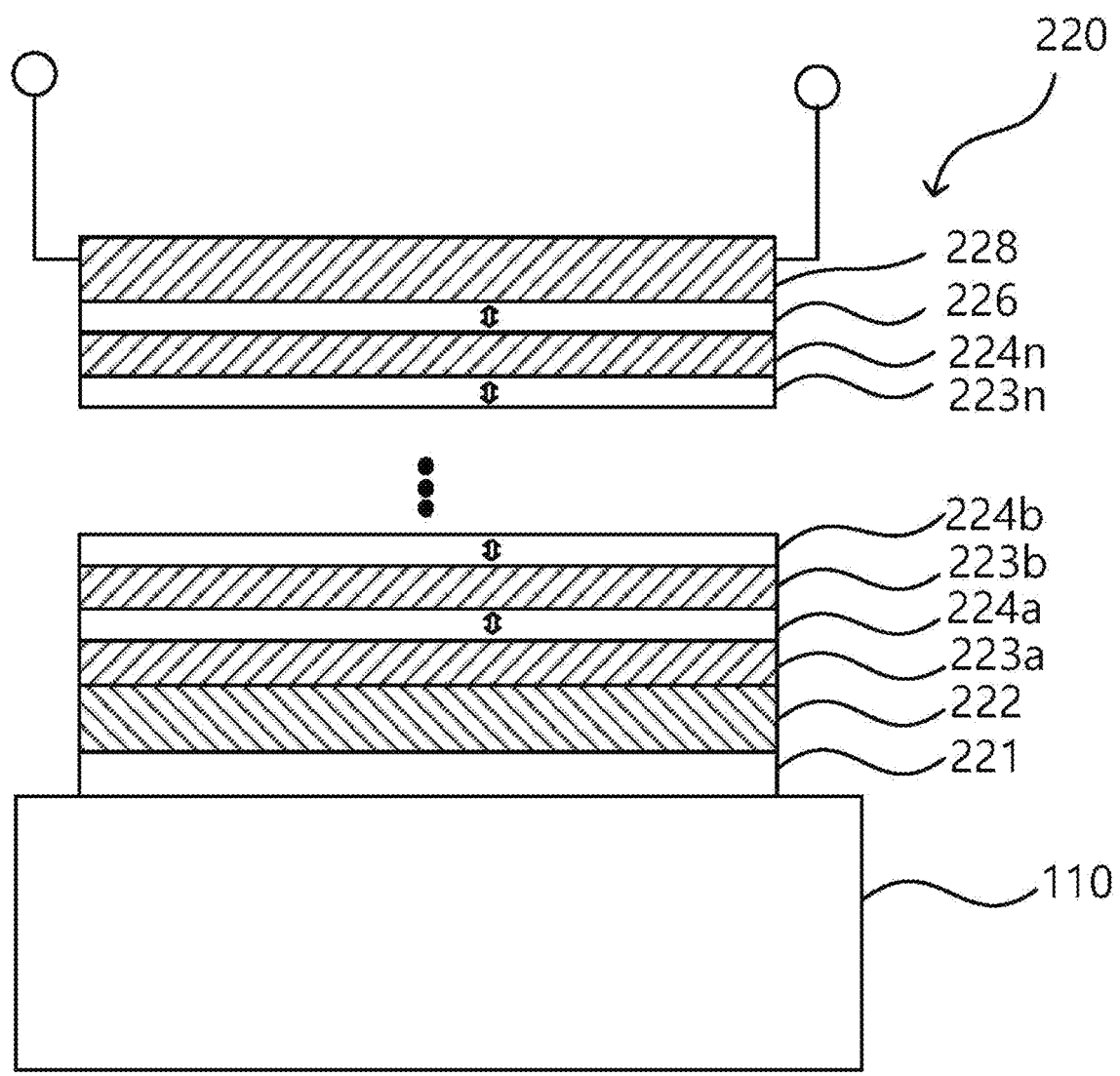
FIG. 3 is a cross-sectional view illustrating a spin-orbit torque magnetic device according to an embodiment of the present invention.

FIG. 3 is a cross-sectional view illustrating a spin-orbit torque magnetic device according to an embodiment of the present invention.

Referring to FIG. 3, the spin current pattern 220 includes a seed layer 221 disposed on a substrate 110, a first non-magnetic conductive layer 222 disposed on the seed layer 221, a second non-magnetic conductive layer 228, and a magnetic layer 226 disposed between the first non-magnetic conductive layer and the second non-magnetic conductive layer.

The spin current pattern 220 may further include at least a pair of auxiliary non-magnetic conductive layers 223a and an auxiliary magnetic layer 224a alternately disposed between the first non-magnetic conductive layer 222 and the magnetic layer 226. The auxiliary non-magnetic conductive layers 223a to 223n and the auxiliary magnetic layers 224a to 224n may provide a multilayer thin film structure. The auxiliary magnetic layer or the magnetic layer may be subjected to a tensile strain by the neighboring non-magnetic conductive layer. Therefore, according to the ratio of the thin film lattice constant of the magnetic layer to the reference bulk lattice constant of the auxiliary magnetic layers 224a to 224n and the magnetic layer 226, the strain in the longitudinal direction parallel to the main surface of the magnetic layer may be 6%, preferably 9% or more.

The auxiliary magnetic layers 224a to 224n and the magnetic layer 226 may be phase-changed from the non-magnetic oxide layer to the ferromagnetic material by the irradiation of the low energy hydrogen ion, and the lattice constant may maintain the value of the first non-magnetic conductive layer 222. Accordingly, the auxiliary magnetic layer or the magnetic layer may be subjected to a tensile strain in the plane and may exhibit increased spin-orbit coupling strength in an out-of-plane direction.

The spin-current pattern 220 may be a Si substrate/Ta(4 nm)/Pd(3 nm)/Reduced [Co(0.4 nm)/Pd(1 nm)]10/Pd(2 nm). The seed layer 221 may be Ta(4 nm), the first non-magnetic conductive layer 222 may be Pd(3 nm), the second non-magnetic conductive layer may be Pd(2 nm), and the magnetic layer 226 may be Co(0.4 nm). The auxiliary magnetic layers 224a to 224n and the auxiliary non-magnetic conductive layers 223a to 223n may be reduced Co(0.4 nm)/Pd(1 nm).

Figure 4:
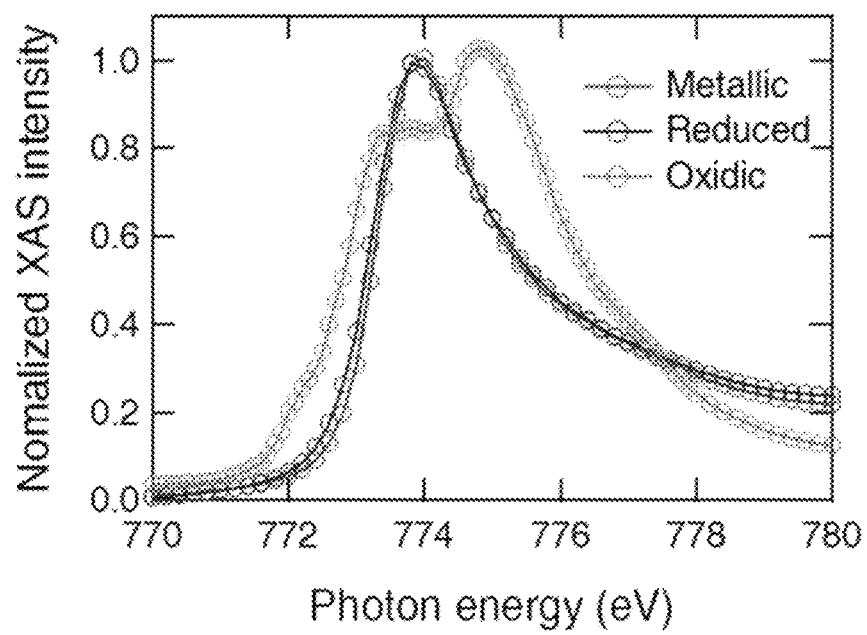
FIG. 4 is an X-ray absorption spectroscopy (XAS) measurement result of the magnetic material Co in the spin-orbit torque magnetic device.

FIG. 4 is an X-ray absorption spectroscopy (XAS) measurement result of the magnetic material Co in the spin-orbit torque magnetic device.

Referring to FIG. 4, the XAS data is normalized to the $L_3$ edge of cobalt (Co). The first sample (see 'Metallic') may be a Si substrate/Ta(4 nm)/Pd(3 nm)/[metallic Co(0.4 nm)/Pd(1 nm)]$_{10}$/Pd(2 nm) structure. The second sample (refer to as 'Reduced') according to an embodiment of the present invention may be Si substrate/Ta(4 nm)/Pd(3 nm)/[Reduced Co(0.4 nm)/Pd(1 nm)]$_{10}$/Pd(2 nm). The third sample (see Oxidic) may be Si substrate/Ta(4 nm)/Pd(3 nm)/[Co$_3$O$_4$ (0.6 nm)/Pd(1 nm)]$_{10}$/Pd(2 nm). In the first sample, the Co layers is directly deposited. In the third sample, the Co$_3$O$_4$ Layer is directly deposited. In contrast, the second sample, the reduced Co layers are formed by reducing the Co$_3$O$_4$ layer by using hydrogen ion irradiation (500 eV) with a dose of $1.48 \times 10^{17}$/cm$^2$ at 500 eV.

According to the XAS results, the first sample including metal cobalt (Co) and the second sample including reduced cobalt (Co) cannot be distinguished with each other.

Figure 5:
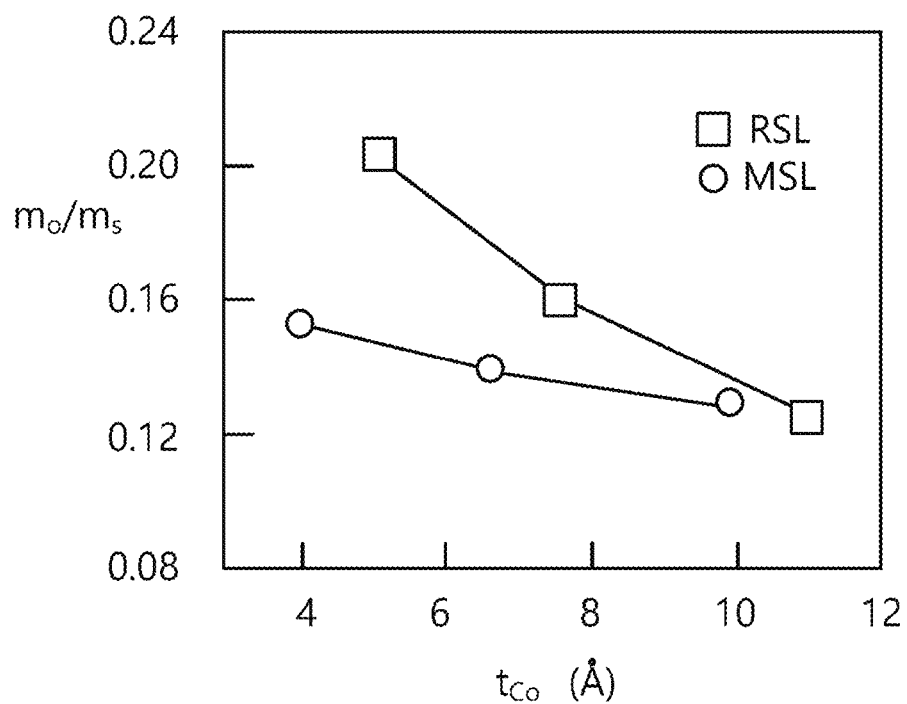
FIG. 5 is a result showing the ratio ($m_o/m_s$) of the orbital moment ($m_o$) to the spin moment ($m_s$) of a magnetic material Co in the spin-orbit torque magnetic device of FIG. 3.

FIG. 5 is a result showing the ratio ($m_o/m_s$) of the orbital moment ($m_o$) to the spin moment ($m_s$) of the spin-orbit torque magnetic device of FIG. 3.

Referring to FIG. 5, a measurement was performed in the perpendicular direction using x-ray magnetic circular dichroism (XMCD). The first sample (referred to as 'MSL') is a structure having Si substrate/Ta(4 nm)/Pd(3 nm)/[metallic Co(t$_{Co}$)/Pd(1 nm)]$_{10}$/Pd(2 nm). The second sample (referred to as 'RSL') according to an embodiment of the present invention is a structure having Si substrate/Ta(4 nm)/Pd(3 nm)/Reduced Co(t$_{Co}$)/Pd(1 nm)]$_{10}$/Pd(2 nm). The orbital moment versus the normalized spin moment of the second sample is increased by about 30% at a thickness of Co of 0.6 nm or less than that of the first sample. The increase of the orbital moment relative to the spin moment may be interpreted as the increase of the spin-orbit coupling in the perpendicular direction of a main surface of the magnetic material having the hetero-junction.

Figure 6:
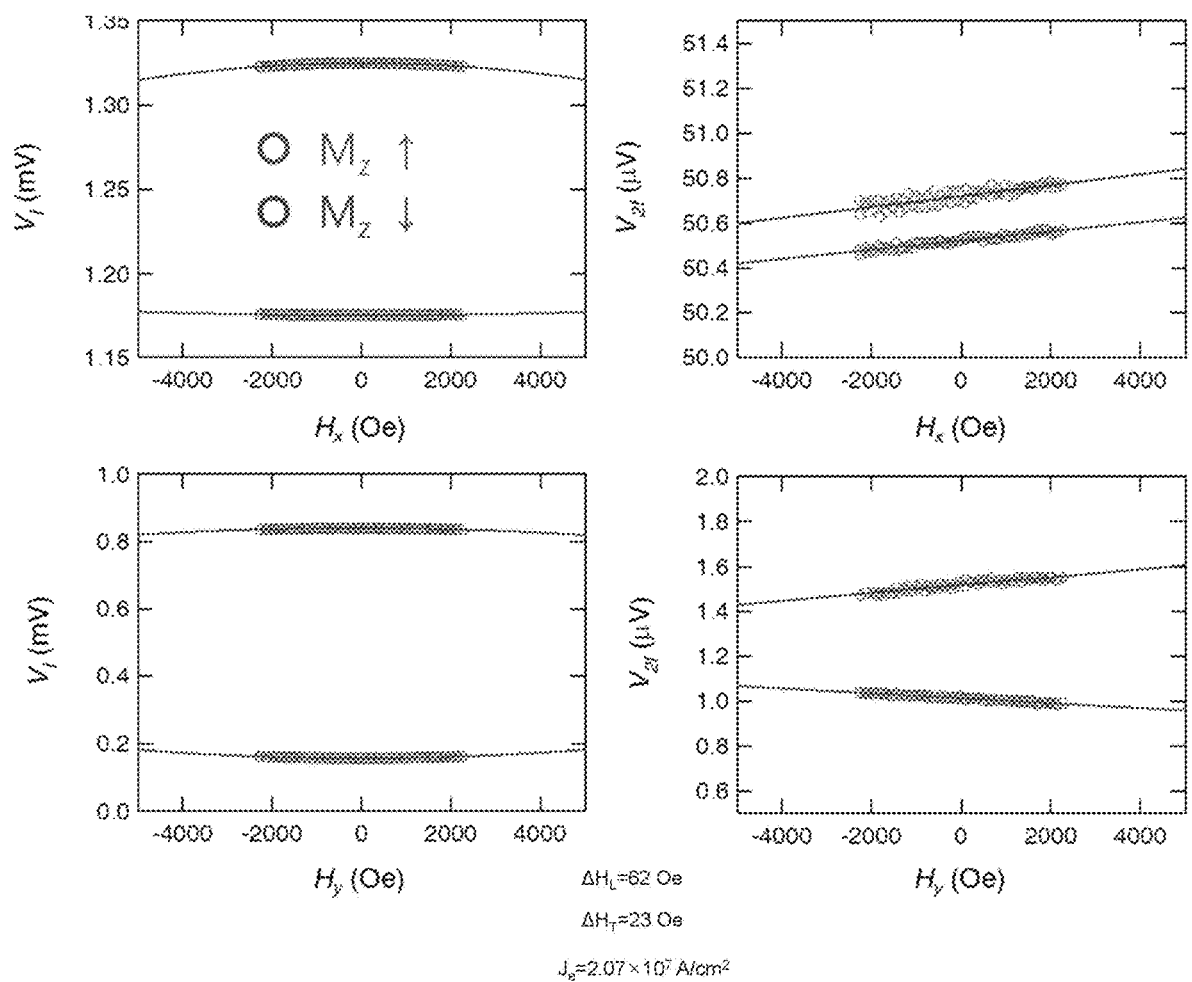
FIGS. 6 and 7 are graphs illustrating the first sample of the conventional multilayer thin film structure, and the harmonic signal according to the external magnetic field in the multilayer thin film structure according to an embodiment of the present invention, respectively
Figure 7:
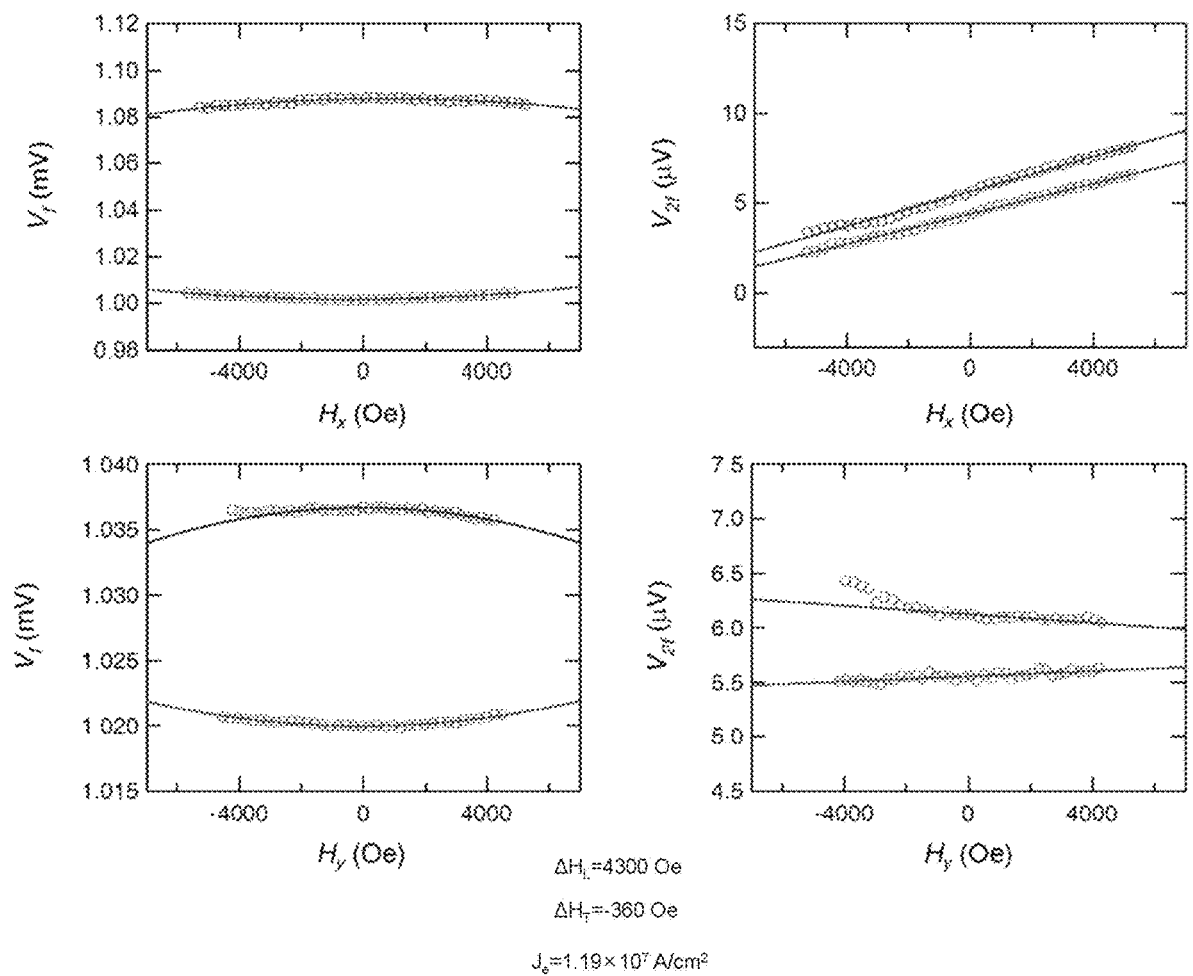

FIGS. 6 and 7 are graphs illustrating harmonic signals according to an external magnetic field on the first sample of the reference multilayer thin film structure (referred to as 'MSL') according to the respective comparison example, and the multilayer thin film structure (referred to as 'RSL') according to an embodiment of the present invention, respectively.

Referring to FIG. 6, the first sample (MSL) is a structure having Si substrate/Ta(4 nm)/Pd(3 nm)/[metallic Co(0.4 nm)/Pd(1 nm)]$_{10}$/Pd.

The x-axis is along an extension direction of the spin-current pattern parallel to the main surface of the spin-current pattern, and the y-axis is along a direction perpendicular to the x-axis out of the arrangement plane of the spin-current pattern. The spin orbit torque may include a torque referred to as longitudinal torque or damping-like torque referred to as field-like torque or transverse torque. The effective magnetic field may be calculated as follows.

$$\Delta H_{T(L)} = -2 \frac{\partial V_{2f}}{\partial H_{T(L)}} \bigg/ \frac{\partial^2 V_f}{\partial H_{T(L)}^2} \qquad \text{[Equation 1]}$$

Here, $V_f$ is the amplitude of the first harmonic component, and $V_{2f}$ is the amplitude of the second harmonic component. The field-like torque is proportional to the transverse effective field (HT; $\Delta H_T$) and the damping-like torque is proportional to the longitudinal effective field (HL; $\Delta H_L$). $\Delta H_L$ is 62 Oe and $\Delta H_T$ is 23 Oe of the first sample. The in-plane current density is $2.07 \times 10^7$ A/cm$^2$.

Referring to FIG. 7, the second sample is a Si substrate/Ta(4 nm)/Pd(3 nm)/[reduced Co(0.5 nm)/Pd(1 nm)]$_{10}$/Pd(2 nm) structure. $\Delta H_L$ is 4300 Oe and $\Delta H_T$ is −360 Oe in the second sample. The in-plane current density is $1.19 \times 10^7$ A/cm$^2$. The effective magnetic field of the second sample may be increased by about several tens of times as compared with the first sample.

The spin-orbit torque may be expected to cancel each other in the superlattice structure because the interfaces are symmetrical to each other. However, unexpectedly, according to the experimental results of the second sample, the spin-orbit torque was significantly increased in the superlattice structure having a reduced cobalt.

TABLE 1

|  | $\Delta H_L/J_C$ | $\Delta H_T/J_C$ |
| --- | --- | --- |
| [Metallic Co/Pd]$_{10}$ | $16.7 \times 10^{-6}$ | $2.3 \times 10^{-6}$ |
| [Reduced Co/Pd]$_{10}$ | $268.1 \times 10^{-6}$ | $35.8 \times 10^{-6}$ |

The $\Delta H_T$ or $\Delta H_L$, that may be generated for each current density, is significantly higher in the second sample ([Reduced Co/Pd]) than the first sample ([Metallic Co/Pd]).

The [reduced Co/Pd]$_n$ structure may be interpreted to generate a high spin-orbit torque. In addition, the [reduced Co/Pd]$_n$ electron band structure having a large spin-orbit coupling may change the number of charges in Co/Pd by irradiating hydrogen. By adjusting the concentration of the hydrogen to control the height of the Fermi energy, the spin hole conductivity may be controlled to be maximized. Generally, it is known that the Fermi energy affects the spin-hole conductivity (Phys. Rev. Lett. 100, 096401 Published 3 Mar. 2008).

Figure 8:
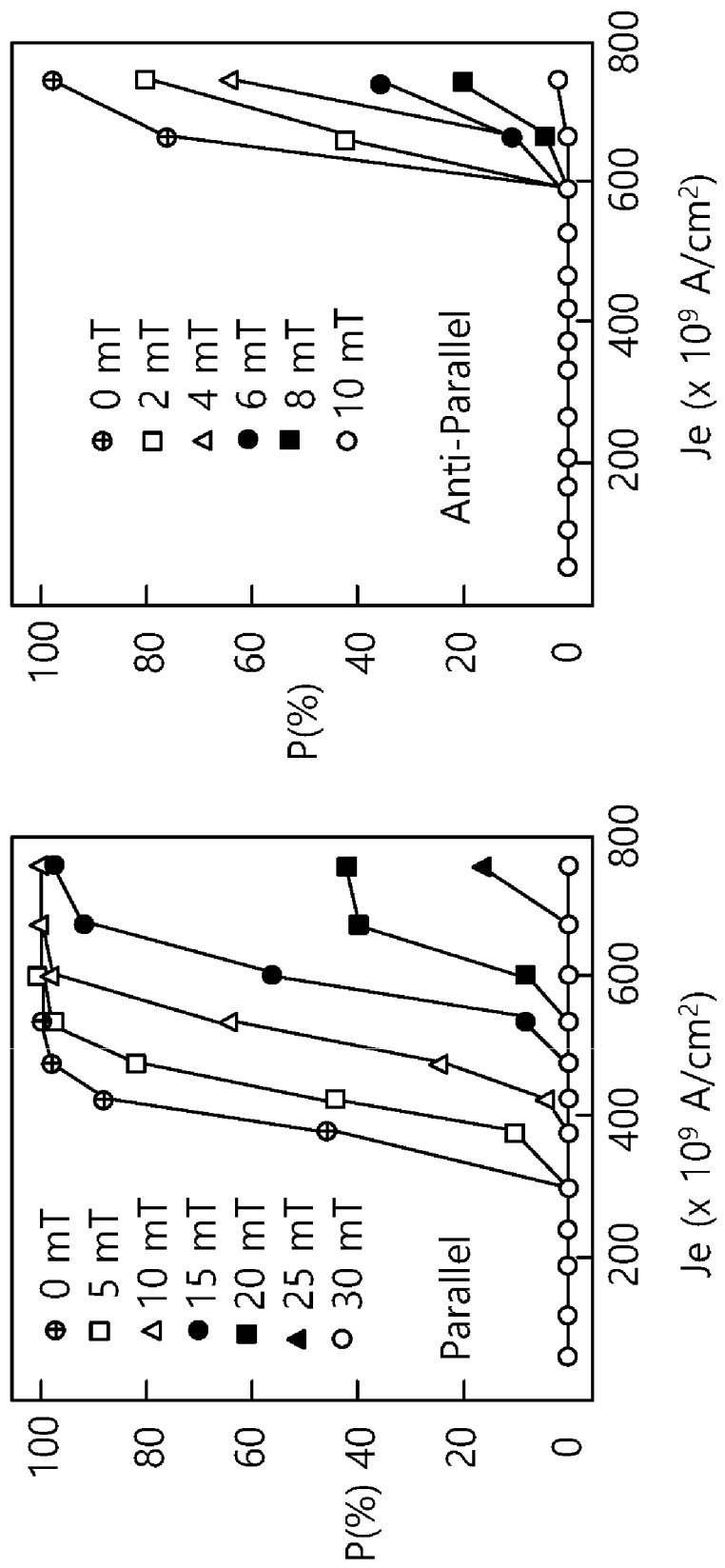
FIG. 8 is a graph showing the probability that a magnetic layer is magnetically reversed by a spin current injection according to an embodiment of the present invention.

FIG. 8 is a graph showing the magnetization inversion of the spin-current pattern according to an embodiment of the present invention.

Referring to FIG. 8, the sample is a structure having substrate/Ta(4 nm)/Pd(3 nm)/[reduced Co(0.5 nm)/Pd(1 nm)]₁₀/Pd(2 nm). For measurement, a current pulse of 10 nsec is applied every second to the sample. The external magnetic field (Hz) was applied almost perpendicularly to the arrangement plane of the spin-current pattern and the intensity of the external magnetic field (Hz) was applied in parallel (a) or anti-parallel (b) to the initial magnetization direction of the magnetic layer. The external magnetic field (Hz) was applied to eliminate thermally assisted switching.

When the external magnetic field (Hz) is parallel to the initial magnetization direction, the magnetization inversion switching is initiated when the applied current density is $3.0 \times 10^{11}$ A/cm², and when the density is $5.0 \times 10^{11}$ A/cm², the magnetization inversion switching is completely performed. As the intensity of the external magnetic field is increasing, the switching current density increases.

When the external magnetic field (Hz) is anti-parallel to the initial magnetization direction, the switching current is increased as compared with the case where the switching current is parallel.

Figure 9:
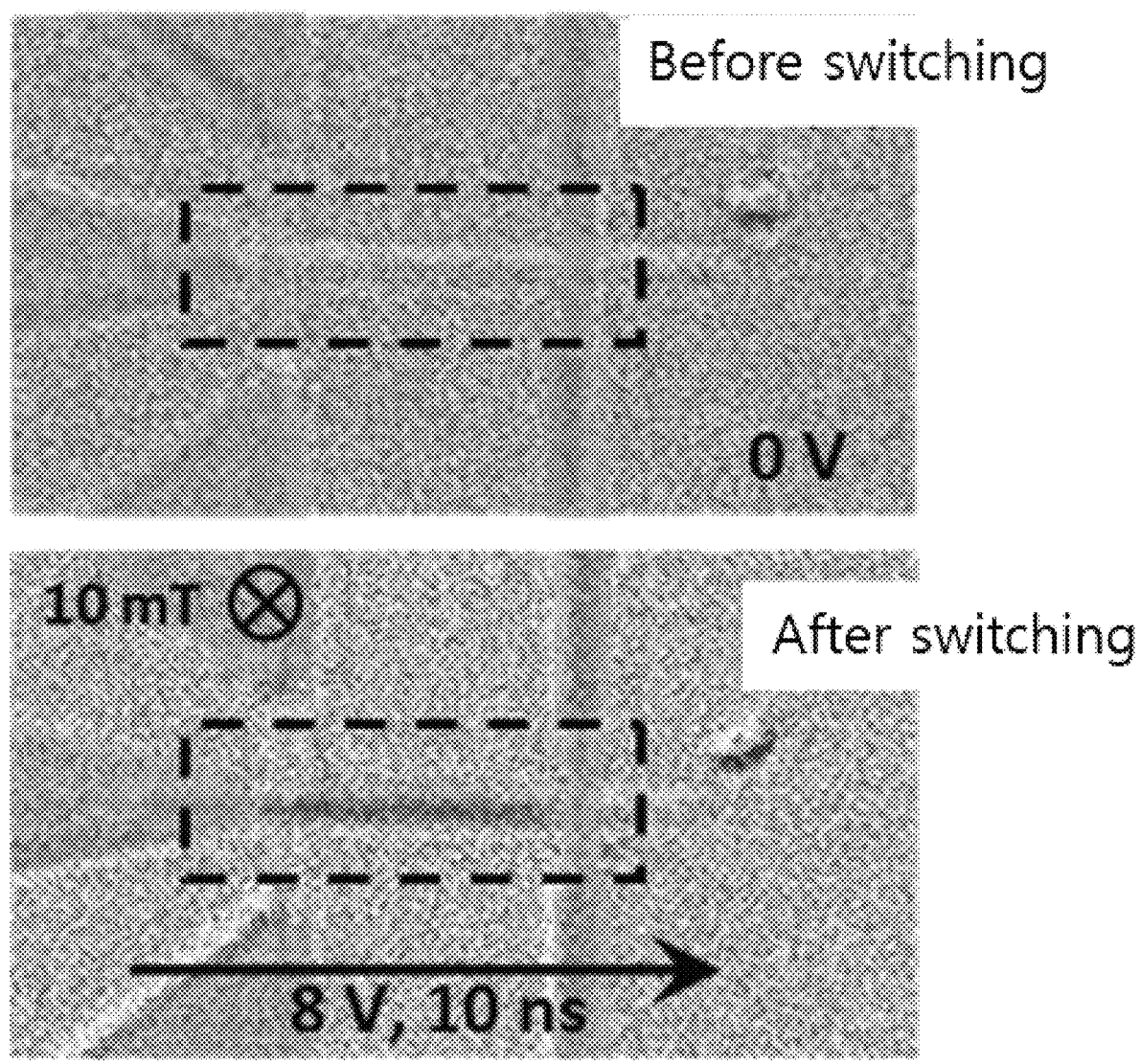
FIG. 9 is a magneto-optic Kerr effect (MOKE) image showing a state that the generated spin-current magnetically reverses (switches) the magnetic layer.

FIG. 9 is a magneto-optic Kerr effect (MOKE) image showing a magnetization inversion of the spin-current pattern.

Referring to FIG. 9, when the external magnetic field (Hz) is 10 mT, the magnetization inversion is performed by a current pulse of 10 nsec.

Figure 10:
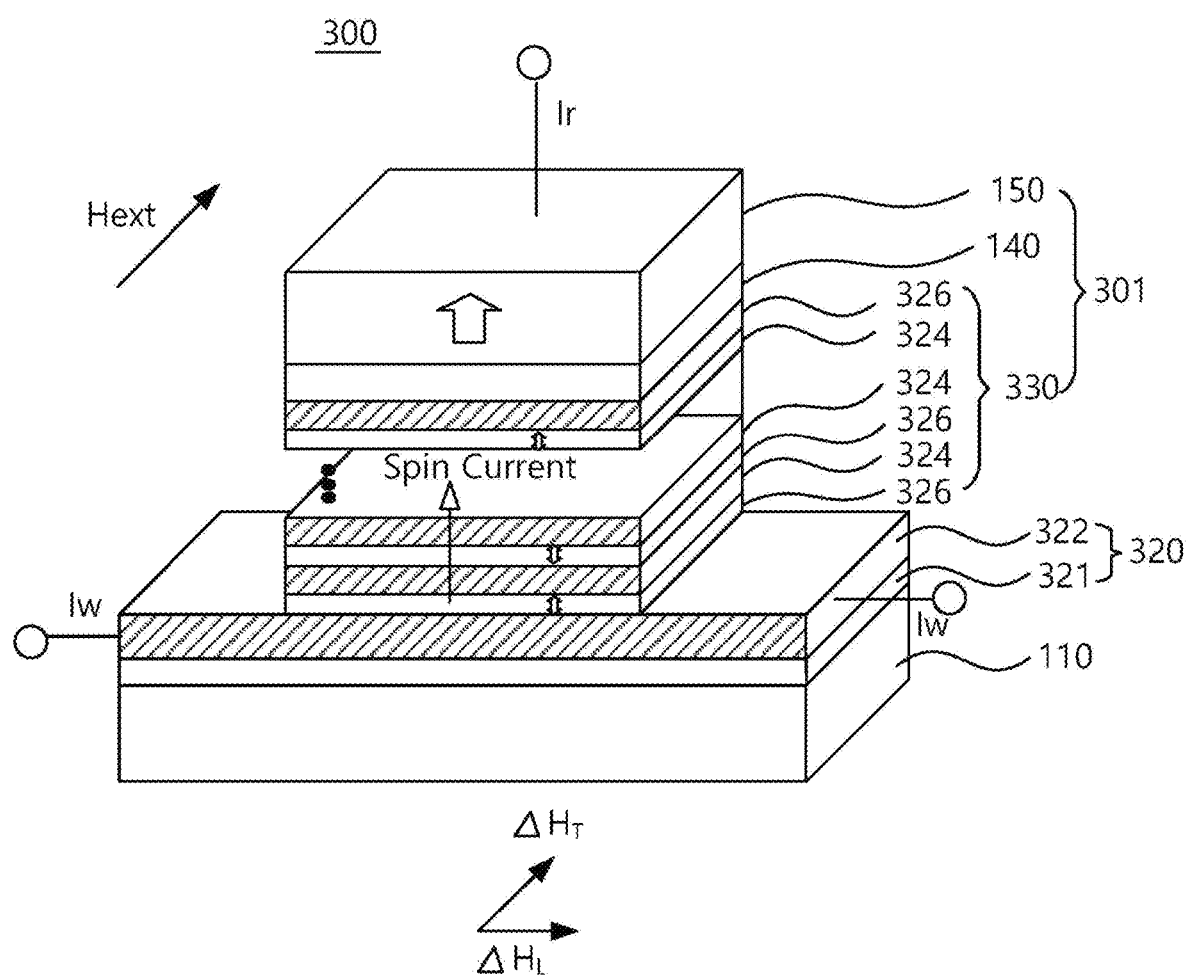
FIG. 10 is a perspective view showing a magnetic device according to another embodiment of the present invention.

FIG. 10 is a perspective view showing a magnetic device according to another embodiment of the present invention.

Referring to FIG. 10, a spin-orbit torque magnetic device 300 includes a spin-current pattern 320 disposed on a substrate 110 and generating a spin current perpendicular to an arrangement plane by an in-plane current Iw; and a free magnetic layer 330 arranged to be in contact with the spin-current pattern 320 and magnetically inverted by the spin current. The free magnetic layer 330 may include a multilayer thin film magnetic layer 326 and a non-magnetic conductive layer 324 which are alternately arranged. The magnetic layer 326 may have a perpendicular magnetic anisotropy, and is magnetically inverted by the spin current. The magnetic layer 326 may be subjected to a tensile strain by the non-magnetic conductive layer 324. The strain in the longitudinal direction, which is provided as the ratio of the thin film lattice constant of the magnetic layer to the reference bulk lattice constant of the magnetic layer 326 may be 9 percent or more. The magnetic layer 326 may be disposed between the non-magnetic conductive layers to receive the tensile stainless.

The in-plane current Iw flows along the extending direction of the spin-current pattern 320 and a spin current perpendicular to the arrangement plane is applied to the free magnetic layer 330 by the in-plane current. Thus, the spin current switches the magnetization direction of the free magnetic layer 330. The spin-current pattern 320 may include a seed layer 321 and a spin-current non-magnetic conductive layer 322. The seed layer 321 may be Ta, and the spin-current non-magnetic conductive layer 322 may be Pd.

The magnetic layer 326 may be reduced by applying a hydrogen ion irradiation process to the non-magnetic oxide layer. A phase of the magnetic layer 326 may be changed from the paramagnetic material to the ferromagnetic material through the hydrogen ion irradiation, and the thin film lattice constant of the magnetic layer may be maintained to be the lattice constant of the non-magnetic conductive layer 324. The non-magnetic oxide layer may be Co3O4, and the magnetic layer 326 may be Co. The non-magnetic oxide may be reduced by the hydrogen ion irradiation and then, the phase thereof may be changed into a Co thin film, but the thin film lattice constant may substantially maintain the lattice constant of the non-magnetic conductive layer 324. In the hydrogen ion irradiation process, the ion energy may be several keV (kilo electron volt) or less. Preferably, the ion energy may be in the range of 300 eV to 500 eV.

The magnetic layer 326 and the non-magnetic conductive layer 324 may include hydrogen. The hydrogen may increase the spin-orbit torque or the spin-hole conductivity by controlling the Fermi energy of the magnetic layer and the non-magnetic conductive layer.

The magnetic tunnel junction 301 may include the free magnetic layer 330, the fixed magnetic layer 150, and a tunnel insulating layer 140 disposed between the free magnetic layer and the fixed magnetic layer. The free magnetic layer 330 and the fixed magnetic layer 150 may have a perpendicular magnetic anisotropy. The external magnetic field (Hext) may provide stable switching of the free magnetic layer 330.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A spin-orbit torque magnetic device comprising:
a spin-current pattern generating a spin current perpendicular to a main plane of the spin-current pattern by an in-plane current; and
a free magnetic layer disposed in contact with the spin-current pattern and having a perpendicular magnetic anisotropy magnetically switchable by the spin current,
wherein the spin-current pattern comprising:
a first non-magnetic conductive layer;
a second non-magnetic conductive layer arranged oppositely to the first non-magnetic conductive layer; and
a magnetic layer interposed between the first non-magnetic conductive layer and the second non-magnetic conductive layer, the magnetic layer having perpendicular magnetic anisotropy,
wherein an atomic arrangement is aligned based on the first non-magnetic conductive layer,
wherein the magnetic layer is subjected to tensile strain by the first non-magnetic conductive layer and the second non-magnetic conductive layer,
wherein the tensile strain in the longitudinal direction parallel to a main surface of the magnetic layer, which is provided as the ratio of a lattice constant of the magnetic layer with respect to a reference bulk lattice constant of the magnetic layer, is 6 percent or more.

2. The spin-orbit torque magnetic device of claim 1, wherein a reference bulk lattice constant of the magnetic layer is smaller than a lattice constant of the first non-magnetic conductive layer or the second non-magnetic conductive layer.

3. The spin-orbit torque magnetic device of claim 1, wherein the magnetic layer is provided by applying a hydrogen ion irradiation process to a non-magnetic oxide layer to be reduced, and the lattice constant of the magnetic layer is maintained to be a lattice constant of the first non-magnetic conductive layer.

4. The spin-orbit torque magnetic device of claim 3, wherein the magnetic layer is in a pseudomorphic epitaxial state so as to match the lattice constant of the magnetic layer to be identical to the lattice constant of the non-magnetic conductive layer.

5. The spin-orbit torque magnetic device of claim 1 further comprising:
   a fixed magnetic layer disposed oppositely to the free magnetic layer; and
   a tunnel insulating layer interposed between the free magnetic layer and the fixed magnetic layer.

6. The spin-orbit torque magnetic device of claim 1, wherein the spin-current pattern further comprises at least a pair of auxiliary non-magnetic conductive layers and an auxiliary magnetic layer alternately disposed between the first non-magnetic conductive layer and the magnetic layer,
   wherein the auxiliary non-magnetic conductive layer and the auxiliary magnetic layer has a multilayer thin film structure.

7. A spin-orbit torque magnetic device comprising:
   a spin-current pattern generating a spin current perpendicular to the arrangement plane by an in-plane current; and
   a free magnetic layer disposed in contact with the spin-current pattern and magnetically switchable by the spin current,
   wherein the free magnetic layer includes a magnetic layer and a non-magnetic conductive layer which have a multilayer thin film structure disposed alternately to each other,
   wherein the magnetic layer has a perpendicular magnetic anisotropy and is magnetically switchable by the spin current, and the magnetic layer is subjected to a tensile strain by the non-magnetic conductive layer,
   wherein the tensile strain in the longitudinal direction parallel to a main surface of the magnetic layer, which is provided as a ratio of a lattice constant of the magnetic layer with respect to a reference bulk lattice constant of the magnetic layer is 6 percent or more.

8. The spin-orbit torque magnetic device of claim 7, wherein a reference bulk lattice constant of the magnetic layer is smaller than a lattice constant of the non-magnetic conductive layer.

9. The spin-orbit torque magnetic device of claim 7, wherein the magnetic layer is provided by reducing an oxide layer, and the lattice constant of the magnetic layer is maintained to be the lattice constant of the non-magnetic conductive layer.

10. The spin-orbit torque magnetic device of claim 9, wherein the oxide layer is cobalt oxide (Co3O4) and the magnetic layer is cobalt (Co).

11. The spin-orbit torque magnetic device of claim 9, wherein the magnetic layer is in a pseudomorphic epitaxial state so as to match the lattice constant of the magnetic layer with the lattice constant of the non-magnetic conductive layer.

12. The spin-orbit torque magnetic device of claim 7, wherein a thickness of the magnetic layer may be 0.2 nm to 0.6 nm.

13. The spin-orbit torque magnetic device of claim 7, wherein the non-magnetic conductive layer is formed by palladium (Pd), and the magnetic layer is formed by cobalt (Co).

14. A magnetic stacked structure generating a spin current by spin-orbit coupling comprising:
   a first non-magnetic conductive layer; and
   a magnetic layer formed on the first non-magnetic conductive layer,
   wherein a reference bulk lattice constant of the magnetic layer is smaller than a lattice constant of the first non-magnetic conductive layer,
   wherein a tensile strain in a longitudinal direction parallel to a main surface of the magnetic layer which is provided as a ratio of the lattice constant of the magnetic layer with respect to a reference bulk lattice constant of the magnetic layer is 6 percent or more.

15. A tensile deformed magnetic laminate of claim 14, wherein the tensile strain is 9 percent or more.

16. A spin-orbit torque magnetic device comprising:
   a spin-current pattern generating a spin current perpendicular to a main plane of the spin-current pattern by an in-plane current; and
   a free magnetic layer disposed in contact with the spin-current pattern and having a perpendicular magnetic anisotropy magnetically switchable by the spin current,
   wherein the spin-current pattern comprising:
      a first non-magnetic conductive layer;
      a second non-magnetic conductive layer arranged oppositely to the first non-magnetic conductive layer; and
      a magnetic layer interposed between the first non-magnetic conductive layer and the second non-magnetic conductive layer, the magnetic layer having perpendicular magnetic anisotropy,
      wherein an atomic arrangement is aligned based on the first non-magnetic conductive layer,
      wherein the magnetic layer is subjected to tensile strain by the first non-magnetic conductive layer and the second non-magnetic conductive layer,
      wherein the magnetic layer and the first non-magnetic conductive layer contain hydrogen, and the hydrogen controls the Fermi energy of the magnetic layer and the first non-magnetic conductive layer.

17. A spin-orbit torque magnetic device comprising:
   a spin-current pattern generating a spin current perpendicular to a main plane of the spin-current pattern by an in-plane current; and
   a free magnetic layer disposed in contact with the spin-current pattern and having a perpendicular magnetic anisotropy magnetically switchable by the spin current,
   wherein the spin-current pattern comprising:
      a first non-magnetic conductive layer;
      a second non-magnetic conductive layer arranged oppositely to the first non-magnetic conductive layer; and
      a magnetic layer interposed between the first non-magnetic conductive layer and the second non-magnetic conductive layer, the magnetic layer having perpendicular magnetic anisotropy,
      wherein an atomic arrangement is aligned based on the first non-magnetic conductive layer,
      wherein the magnetic layer is subjected to tensile strain by the first non-magnetic conductive layer and the second non-magnetic conductive layer,
      wherein the magnetic layer is provided by applying an hydrogen ion irradiation process to a non-magnetic oxide layer to be reduced, and the lattice constant of the magnetic layer is maintained to be a lattice constant of the first non-magnetic conductive layer, wherein the non-magnetic oxide layer is cobalt oxide (CO₃O₄), and the magnetic layer is cobalt (Co).

18. A spin-orbit torque magnetic device comprising:
a spin-current pattern generating a spin current perpendicular to a main plane of the spin-current pattern by an in-plane current; and
a free magnetic layer disposed in contact with the spin-current pattern and having a perpendicular magnetic anisotropy magnetically switchable by the spin current,
wherein the spin-current pattern comprising:
    a first non-magnetic conductive layer;
    a second non-magnetic conductive layer arranged oppositely to the first non-magnetic conductive layer; and
    a magnetic layer interposed between the first non-magnetic conductive layer and the second non-magnetic conductive layer, the magnetic layer having perpendicular magnetic anisotropy,
        wherein an atomic arrangement is aligned based on the first non-magnetic conductive layer,
        wherein the magnetic layer is subjected to tensile strain by the first non-magnetic conductive layer and the second non-magnetic conductive layer,
wherein the thickness of the magnetic layer may be 0.2 nm to 0.6 nm.

19. A spin-orbit torque magnetic device comprising:
a spin-current pattern generating a spin current perpendicular to a main plane of the spin-current pattern by an in-plane current; and
a free magnetic layer disposed in contact with the spin-current pattern and having a perpendicular magnetic anisotropy magnetically switchable by the spin current,
wherein the spin-current pattern comprising:
    a first non-magnetic conductive layer;
    a second non-magnetic conductive layer arranged oppositely to the first non-magnetic conductive layer; and
    a magnetic layer interposed between the first non-magnetic conductive layer and the second non-magnetic conductive layer, the magnetic layer having perpendicular magnetic anisotropy,
        wherein an atomic arrangement is aligned based on the first non-magnetic conductive layer,
        wherein the magnetic layer is subjected to tensile strain by the first non-magnetic conductive layer and the second non-magnetic conductive layer,
wherein the first non-magnetic conductive layer and the second non-magnetic conductive layers are formed by palladium (Pd), and the magnetic layer is formed by cobalt (Co).

20. A spin-orbit torque magnetic device comprising:
a spin-current pattern generating a spin current perpendicular to the arrangement plane by an in-plane current; and
a free magnetic layer disposed in contact with the spin-current pattern and magnetically switchable by the spin current,
wherein the free magnetic layer includes a magnetic layer and a non-magnetic conductive layer which have a multilayer thin film structure disposed alternately to each other,
wherein the magnetic layer has a perpendicular magnetic anisotropy and is magnetically switchable by the spin current, and the magnetic layer is subjected to a tensile strain by the non-magnetic conductive layer,
wherein the magnetic layer and the non-magnetic conductive layer contain hydrogen, and the hydrogen controls the Fermi energy of the magnetic layer and the non-magnetic conductive layer.

* * * * *